(12) United States Patent
Heinrich et al.

(10) Patent No.: US 9,756,726 B2
(45) Date of Patent: Sep. 5, 2017

(54) ELECTRONIC DEVICE AND METHOD OF FABRICATING AN ELECTRONIC DEVICE

(71) Applicant: Infineon Technologies AG, Neubiberg (DE)

(72) Inventors: Alexander Heinrich, Regensburg (DE); Peter Scherl, Regensburg (DE); Magdalena Hoier, Seubersdorf (DE); Hans-Joerg Timme, Ottobrunn (DE)

(73) Assignee: Infineon Technologies AG, Neubiberg (DE)

( * ) Notice: Subject to any disclaimer, the term of this patent is extended or adjusted under 35 U.S.C. 154(b) by 121 days.

(21) Appl. No.: 14/071,296

(22) Filed: Nov. 4, 2013

(65) Prior Publication Data

US 2015/0124420 A1 May 7, 2015

(51) Int. Cl.
*H05K 7/10* (2006.01)
*H05K 7/12* (2006.01)
(Continued)

(52) U.S. Cl.
CPC ............ *H05K 1/11* (2013.01); *H01L 24/45* (2013.01); *H01L 24/46* (2013.01); *H01L 24/48* (2013.01); *H01L 24/49* (2013.01); *H01L 24/85* (2013.01); *H05K 1/111* (2013.01); *H05K 1/14* (2013.01); *H01L 2224/45015* (2013.01); *H01L 2224/45028* (2013.01); *H01L 2224/4554* (2013.01); *H01L 2224/45124* (2013.01); *H01L 2224/45139* (2013.01); *H01L 2224/45144* (2013.01); *H01L 2224/45147* (2013.01); *H01L 2224/45184* (2013.01); *H01L 2224/48091* (2013.01); *H01L 2224/48092* (2013.01); *H01L 2224/48137* (2013.01); *H01L 2224/48227* (2013.01); *H01L 2224/48465* (2013.01); (Continued)

(58) Field of Classification Search
USPC .......................................... 361/767; 257/690
See application file for complete search history.

(56) References Cited

U.S. PATENT DOCUMENTS 6,472,602 B1 * 10/2002 Pokrandt .................. 174/117 M
2005/0073039 A1 * 4/2005 Kasuya et al. ................ 257/690
(Continued)

FOREIGN PATENT DOCUMENTS

CN 101410974 A 4/2009
DE 102006041355 A1 3/2008
(Continued)

OTHER PUBLICATIONS

Sripada et al. "Heat Affected Zone in the Wire Electrode During Electronic Flame Off in Bonding." The International Journal of Microcircuits and Electronic Packaging, vol. 22, No. 3. International Microelectronics and Packaging Society, 1999. pp. 203-210.

*Primary Examiner* — Andargie M Aychillhum
(74) *Attorney, Agent, or Firm* — Murphy, Bilak & Homiller, PLLC

(57) ABSTRACT

An electronic device may comprise a semiconductor element and a wire bond connecting the semiconductor element to a substrate. Using a woven bonding wire may improve the mechanical and electrical properties of the wire bond. Furthermore, there may be a cost benefit. Woven bonding wires may be used in any electronic device, for example in power devices or integrated logic devices.

15 Claims, 6 Drawing Sheets

(51) Int. Cl.
*H05K 1/11* (2006.01)
*H05K 1/14* (2006.01)
*H01L 23/00* (2006.01)
*H05K 3/36* (2006.01)
*H05K 3/32* (2006.01)
*H05K 3/40* (2006.01)

(52) U.S. Cl.
CPC ............... *H01L 2224/48507* (2013.01); *H01L 2224/48511* (2013.01); *H01L 2224/85* (2013.01); *H01L 2224/85181* (2013.01); *H01L 2224/85205* (2013.01); *H01L 2224/85207* (2013.01); *H01L 2924/00014* (2013.01); *H01L 2924/13055* (2013.01); *H01L 2924/181* (2013.01); *H05K 3/32* (2013.01); *H05K 3/36* (2013.01); *H05K 3/4015* (2013.01); *H05K 2201/04* (2013.01); *H05K 2203/0285* (2013.01); *Y10T 29/49126* (2015.01)

(56) References Cited

U.S. PATENT DOCUMENTS

| | | | |
|---|---|---|---|
| 2009/0049684 | A1* | 2/2009 | Garcia .................. H01R 43/205 29/747 |
| 2009/0183857 | A1* | 7/2009 | Pierce et al. ................ 165/109.1 |
| 2010/0134043 | A1* | 6/2010 | Kadotani et al. .............. 315/294 |
| 2011/0148543 | A1* | 6/2011 | Bandholz ................ H01L 22/20 333/32 |
| 2012/0083415 | A1 | 4/2012 | Tanaka et al. |
| 2012/0228759 | A1* | 9/2012 | Fan ......................... H01L 24/45 257/737 |

FOREIGN PATENT DOCUMENTS

| | | |
|---|---|---|
| EP | 2159834 A1 | 3/2010 |
| JP | S61101038 A | 5/1986 |

\* cited by examiner

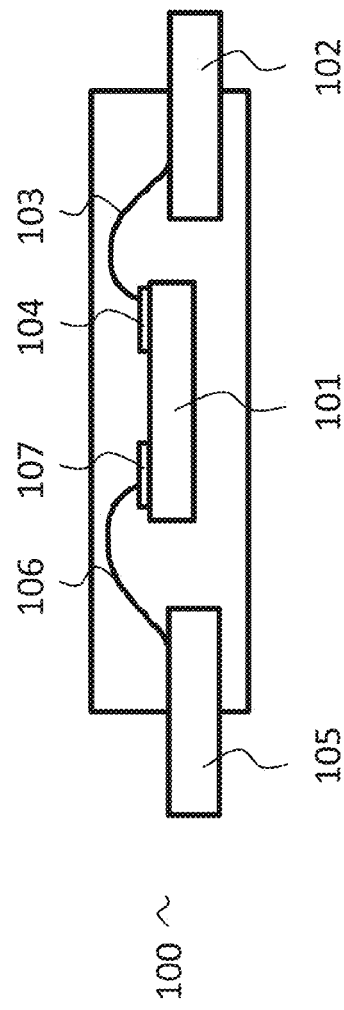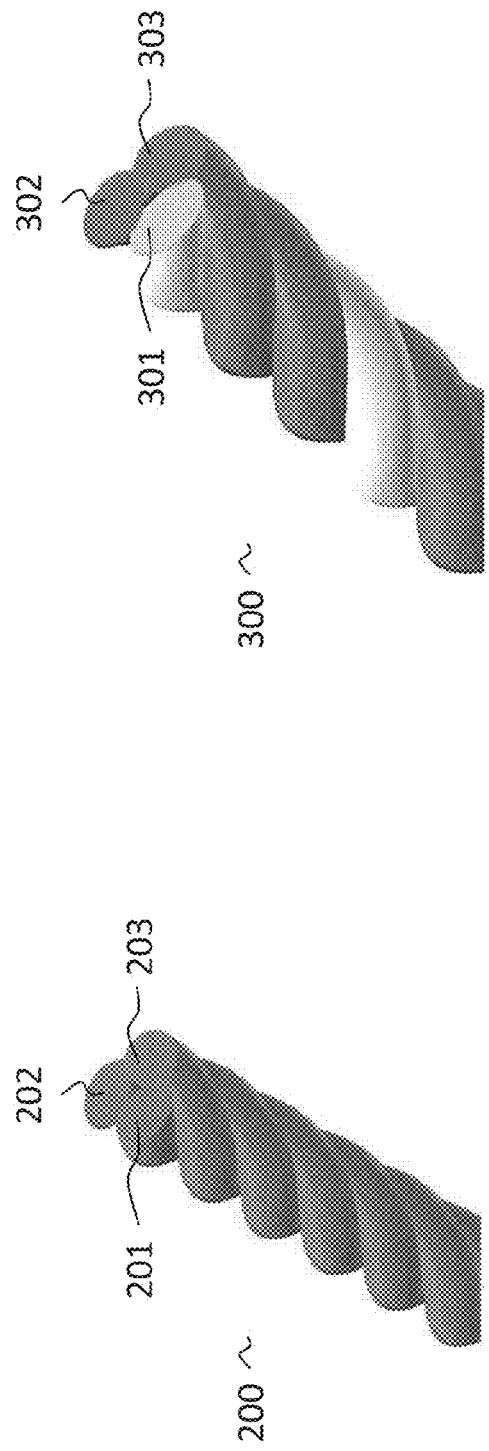

ELECTRONIC DEVICE AND METHOD OF FABRICATING AN ELECTRONIC DEVICE

TECHNICAL FIELD

Embodiments of the present invention relate to an electronic device and a method for fabricating an electronic device. More particularly, embodiments relate to electronic devices comprising wire bonds.

BACKGROUND

An electronic device may comprise a semiconductor element and a wire bond connecting the semiconductor element to a substrate. In certain applications, a standard bonding wire may exhibit sub-optimal mechanical or electrical properties. For these and other reasons there is a need for the present invention.

BRIEF DESCRIPTION OF THE DRAWINGS

The accompanying drawings are included to provide a further understanding of embodiments and are incorporated in and constitute a part of this specification. It should be noted further that the drawings are not to scale or not necessarily to scale.

FIG. 1 schematically shows an embodiment of a semiconductor device.

FIG. 2 schematically shows an embodiment of a woven bonding wire.

FIG. 3 schematically shows an embodiment of a woven bonding wire, wherein strands may comprise different materials.

DESCRIPTION OF EMBODIMENTS

Figure 4:
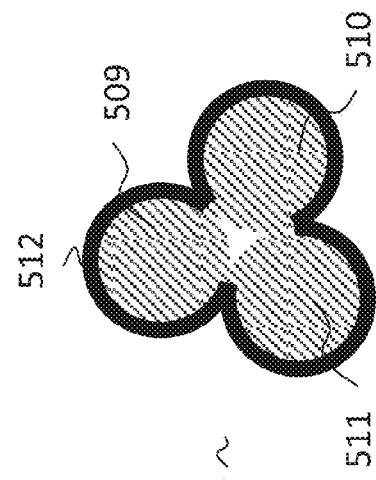
FIG. 4 schematically shows a cross-section view of an embodiment of a woven bonding wire.

The aspects and embodiments are now described with reference to the drawings. In the following description, for purposes of explanation, numerous specific details are set forth in order to provide a thorough understanding of one or more aspects of the embodiments. It is to be understood that other embodiments may be utilized and structural or logical changes may be made without departing from the scope of the present invention.

In the following detailed description, reference is made to the accompanying drawings, which form a part thereof, and in which is shown by way of illustration specific embodiments in which the invention may be practiced. It may be evident, however, to one skilled in the art that one or more aspects of the embodiments may be practiced with a lesser degree of the specific details. In other instances, known structures and elements are shown in schematic form in order to facilitate describing one or more aspects of the embodiments. In this regard, directional terminology, such as "top," "bottom," "left," "right," "upper," "lower" etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In addition, while a particular feature or aspect of an embodiment may be disclosed with respect to only one of several implementations, such feature or aspect may be combined with one or more other features or aspects of the other implementations as may be desired and advantageous for any given or particular application, unless specifically noted otherwise or unless technically restricted. Furthermore, to the extent that the terms "include," "have," "with" or other variants thereof are used in either the detailed description or the claims, such terms are intended to be inclusive in a manner similar to the term "comprise." The terms "coupled" and "connected," along with derivatives thereof, may be used. It should be understood that these terms may be used to indicate that two elements co-operate or interact with each other regardless of whether they are in direct physical or electrical contact, or they are not in direct contact with each other; intervening elements or layers may be provided between the "bonded," "attached," or "connected" elements. Also, the term "exemplary" is merely meant as an example, rather than the best or optimal. The following detailed description, therefore, is not to be taken in a limiting sense, and the scope of the present invention is defined by the appended claims.

The semiconductor chip(s) described further below may be of different types, may be manufactured by different technologies and may include for example integrated electrical, electro-optical or electro-mechanical circuits and/or passives, logic integrated circuits, control circuits, microprocessors, memory devices, etc.

The embodiments of an electronic device and a method for fabricating an electronic device may use various types of semiconductor chips or circuits incorporated in the semiconductor chips, among them AC/DC or DC/DC converter circuits, power MOS transistors, power schottky diodes, JFETs (Junction Gate Field Effect Transistors), power bipolar transistors, logic integrated circuits, analogue integrated circuits, mixed signal integrated circuits, sensor circuits, MEMS (Micro-Electro-Mechanical-Systems), power integrated circuits, chips with integrated passives, etc. The embodiments may also use semiconductor chips comprising MOS transistor structures or vertical transistor structures like, for example, IGBT (Insulated Gate Bipolar Transistor) structures or, in general, transistor structures in which at least one electrical contact pad is arranged on a first main face of the semiconductor chip and at least one other electrical contact pad is arranged on a second main face of the semiconductor chip opposite to the first main face of the semiconductor chip. Moreover, the embodiments of insulation materials may, for example, be used for providing insulation layers in various types of enclosures and insulation for electrical circuits and components, and/or for providing insulation layers in various types of semiconductor chips or circuits incorporated in semiconductor chips, including the above mentioned semiconductor chips and circuits.

The semiconductor chip(s) can be manufactured from specific semiconductor material, for example Si, SiC, SiGe, GaAs, GaN, or from any other semiconductor material, and, furthermore, may contain one or more of inorganic and organic materials that are not semiconductors, such as for example insulators, plastics or metals.

The semiconductor chip(s) disclosed herein may be thin. In order to allow handling or manipulation of the semiconductor chip, e.g. handling/manipulation required for packaging, eWLP (embedded Wafer Level Packaging), or semiconductor device assembly, the semiconductor chip may form part of a composite chip. A composite chip may comprise the semiconductor chip and a reinforcing chip secured to the semiconductor chip. The reinforcing chip adds stability and/or strength to the composite chip to make it manageable.

The devices described below may include one or more semiconductor chips. By way of example, one or more semiconductor power chips may be included. Further, one or more logic integrated circuits may be included in the devices. The logic integrated circuits may be configured to control the integrated circuits of other semiconductor chips, for example the integrated circuits of power semiconductor chips. The logic integrated circuits may be implemented in logic chips.

The semiconductor chip(s) may have contact pads (or electrodes) which allow electrical contact to be made with the integrated circuits included in the semiconductor chip(s). The electrodes may be arranged all at only one main face(s) of the semiconductor chip(s) or at both main faces of the semiconductor chip(s). They may include one or more electrode metal layers which are applied to the semiconductor material of the semiconductor chip(s). The electrode metal layers may be manufactured with any desired geometric shape and any desired material composition. For example, they may comprise or be made of a material selected of the group of Cu, Ni, NiSn, Au, Ag, Pt, Pd, an alloy of one or more of these metals, an electrically conducting organic material, or an electrically conducting semiconductor material.

The semiconductor chip(s) may be bonded to a carrier. The carrier may be a (permanent) device carrier used for packaging. The carrier may comprise or consist of any sort of material as, for example, ceramic or metallic material, copper or copper alloy or iron/nickel alloy. The carrier can be connected mechanically and electrically with one contact element of the semiconductor chip(s). The semiconductor chip(s) can be connected to the carrier by one or more of re-flow soldering, vacuum soldering, diffusion soldering, or adhering by means of a conductive adhesive. If diffusion soldering is used as the connection technology between the semiconductor chip(s) and the carrier, solder materials can be used which result in inter-metallic phases at the interface between the semiconductor and the carrier due to interface diffusion processes after the soldering process. In case of copper or iron/nickel carriers it is therefore desirable to use solder materials comprising or consisting of AuSn, AgSn, CuSn, AgIn, AuIn or CuIn. Alternatively, if the semiconductor chip(s) are to be adhered to the carrier, conductive adhesives can be used. The adhesives can, for example, be based on epoxy resins which can be enriched with particles of gold, silver, nickel or copper to enhance their electrical conductivity.

The contact elements of the semiconductor chip(s) may comprise a diffusion barrier. The diffusion barrier prevents in case of diffusion soldering that the solder material diffuses from the carrier into the semiconductor chip(s). A thin titanium layer on the contact element may, for example, effect such a diffusion barrier.

Bonding the semiconductor chip(s) to the carrier may e.g. be done by soldering, gluing, or sintering. In case the semiconductor chip (s) are attached by soldering, a soft solder material or, in particular, a solder material capable of forming diffusion solder bonds may be used, for example a solder material comprising one or more metal materials selected from the group of Sn, SnAg, SnAu, SnCu, In, InAg, InCu and InAu.

The semiconductor chip(s) may be covered with an encapsulation material in order to be embedded in an encapsulant (artificial wafer) for eWLP processing or after being bonded to a device carrier (substrate). The encapsulation material may be electrically insulating. The encapsulation material may comprise or be made of any appropriate plastic or polymer material such as, e.g., a duroplastic, thermoplastic or thermosetting material or laminate (prepreg), and may e.g. contain filler materials. Various techniques may be employed to encapsulate the semiconductor chip(s) with the encapsulation material, for example compression molding, injection molding, powder molding, liquid molding or lamination. Heat and/or pressure may be used to apply the encapsulation material.

In several embodiments layers or layer stacks are applied to one another or materials are applied or deposited onto layers. It should be appreciated that any such terms as "applied" or "deposited" are meant to cover literally all kinds and techniques of applying layers onto each other. In particular, they are meant to cover techniques in which layers are applied at once as a whole like, for example, laminating techniques as well as techniques in which layers are deposited in a sequential manner like, for example, sputtering, plating, molding, CVD, etc.

In the following description and claims different embodiments of a method for fabricating a chip module are described as a particular sequence of processes or measures, in particular in a flow diagram. It is to be noted that the embodiments should not be limited to the particular sequence described. Particular ones or all of different processes or measures can also be conducted simultaneously or in any other useful and appropriate sequence.

Referring now to FIG. 1, there is shown an embodiment of an electronic device 100 comprising a semiconductor chip 101, a first substrate 102 and a first bonding wire 103. The first bonding wire 103 electrically connects a first contact pad 104 of semiconductor chip 101 to the first substrate 102. According to an embodiment, the electronic device 100 further comprises a second substrate 105 and a second bonding wire 106. The second bonding wire 106 electrically connects a second contact pad 107 of semiconductor chip 101 to the second substrate 105. Note that the electronic device 100 may comprise further substrates and further bonding wires electrically connecting contact pads on semiconductor chip 101 to the further substrates. These are not shown in FIG. 1. Furthermore, more than one bonding wire may be used to connect semiconductor device 101 with a substrate.

At least one of the bonding wires 103, 106 and the further bonding wires not shown in FIG. 1 may be a woven or twisted bonding wire, that is a bonding wire comprising two or more strands. FIG. 2 shows a detailed view of an embodiment of a woven bonding wire 200 comprising three strands 201, 202, 203.

Woven bonding wires like the woven bonding wire 200 of FIG. 2 may comprise one or more of copper and tungsten and aluminum and silver and gold and an alloy of one or more of these materials and any other suitable electrically conductive material. Furthermore, woven bonding wires may comprise non-conductive material like, for example, a polymer. Non-conductive materials may be used to improve the mechanical properties of the woven bonding wire like, for example, its tensile strength. According to an embodiment, all strands of the woven bonding wire comprise the same material. For example, all strands 201, 202, 203 of FIG. 2 may comprise copper.

According to another embodiment, one or more of the strands may comprise a different material than the other strands. For example, in the embodiment of a woven bonding wire 300 in FIG. 3 strand 301 may comprise tungsten and strands 302 and 303 may comprise copper. Combining strands comprising different materials to form a woven bonding wire like the woven bonding wire 300 of FIG. 3 may improve its mechanical and electrical properties. For example, copper strands may be used for their excellent electrical conductivity and tungsten strands or polymer strands may be used to increase the mechanical stability of the woven bonding wire.

The strands of the woven bonding wire need not necessarily have the same diameter. According to an embodiment of a woven bonding wire the individual strands may have different diameters. For example, one or more strands may have a smaller diameter, in particular about half the diameter of the other strands. For example, strands 201 and 301 may have a smaller diameter than strands 202, 203 and 302, 303 respectively. According to another embodiment of a woven bonding wire all strands have the same diameter.

Referring now to FIG. 4 a cross-section view of an embodiment of a woven bonding wire 400 is shown. The woven bonding wire 400 comprises strands 401, 402, 403. The cross-section of woven bonding wire 400 shows groovings 404, 405, 406 where the strands 401, 402, 403 touch.

Note that embodiments of a woven bonding wire need not necessarily comprise exactly three strands as shown in the exemplary embodiments in FIGS. 2, 3 and 4. In fact, any number of two or more strands may be used. In particular, any number of two to ten strands or even more than ten strands, or even more than 20 strands may be used in some embodiments.

In the embodiment of a woven bonding wire shown in FIG. 4 the three strands 401, 402, 403 are arranged symmetrically around the center axis marked with cross 407. In embodiments with only two strands or more than three strands any suitable configuration of the strands may be used. In some embodiments the center axis of the woven bonding wire coincides with the center axis of a single strand. In other embodiments this is not the case. In some embodiments a woven bonding wire may comprise a cavity encompassed by the strands of the woven bonding wire. The center axis of the woven bonding wire may lie in the center of the cavity.

Figure 5A:
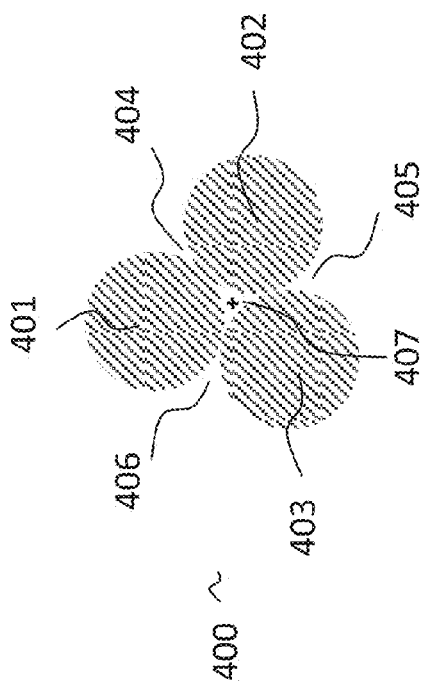
FIG. 5A schematically shows a cross-sectional view of an embodiment of a woven bonding wire, wherein each strand is coated individually.

Referring now to FIG. 5A, there is shown an embodiment 500A of a woven bonding wire comprising cores 501, 502, 503, 504, wherein each of the individual cores is covered by layers or coatings 505, 506, 507, 508 respectively. Each of the cores 501-504 together with its respective coating out of the coatings 505-508 forms a strand of the woven bonding wire 500A. Layers 505-508 may comprise any suitable material, for example a metal or a dielectric material like a polymer for insulation. Layers 505-508 may exhibit any suitable thickness, for example less than 1 µm, between 1 µm and 5 µm, between 5 µm and 10 µm or more than 10 µm. Layers 505-508 may provide one or more of an electrical insulation and protection against deterioration of the strands 501-504.

Figure 5B:
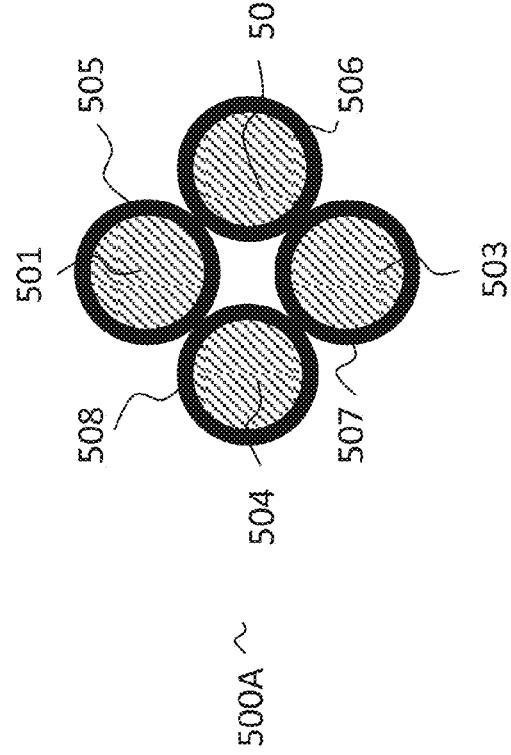
FIG. 5B schematically shows a cross-sectional view of an embodiment of a woven bonding wire, wherein a single coating is used to coat the entire woven bonding wire.

Referring now to FIG. 5B, a further embodiment of a woven bonding wire 500B is shown comprising several cores 509-511 with a common layer or coating 512 on their surface. Layer 512 may comprise the same materials and may exhibit the same thickness as layers 505-508. Layer 512 may provide one or more of an electrical insulation and protection against deterioration of the woven bonding wire 500B.

According to an embodiment, layers or coatings 505-508 and 512 may comprise an electrically conductive material, for example a metal like, for example copper, silver, gold, aluminum, tungsten or a metal alloy of one or more of these materials and any other suitable electrically conductive material. Such layers 505-508 or 512 may be used to conduct an electrical current, in particular a high frequency alternating current. According to an embodiment, the cores 501-504 and 509-511 respectively may be used for mechanical support and may comprise electrically insulating material like, for example, a polymer. Furthermore, more than one layer may be applied, that is a stacked coating of, for example, a second layer coated onto the first layer. The first layer may, for example, be a metal and the second layer may provide insulation.

In high frequency alternating currents, the charge carriers do not penetrate deeply into a conductor but remain in a thin layer close to the surface. This is called the skin effect. For example, in a conductor made of copper, charge carriers penetrate about 2.1 mm into the conductor at a frequency of 1 kHz, 0.21 mm at 100 kHz, 66 µm at 1 MHz and 2.1 µm at 1 GHz. Therefore, it may be advantageous to increase the surface of a bonding wire with a fixed volume V by using a woven bonding wire with the same volume V but a larger surface. For example, by reducing the radius of a wire with volume V to a half quarters its volume. Therefore, with the same volume V, that is the same amount of material, a woven bonding wire with four times the surface area can be produced. Therefore, using a woven bonding wire may significantly increase the maximum ampacity, that is current carrying capability for a bonding wire interconnect. With standard bonding wires, that is bonding wires with a single round strand it is necessary to increase the diameter to increase the ampacity. Since bonding wires typically comprise expensive materials using a woven bonding wire may also reduce the cost.

According to an embodiment of an electronic device, a woven bonding wire is used to conduct an alternating current with a frequency of more than 1 kHz, in particular more than 100 kHz, in particular more than 1 MHz, in particular more than 10 MHz. According to another embodiment of an electronic device a woven bonding wire is used to conduct a current with a frequency of less than 1 kHz, in particular a direct current.

Figure 6:
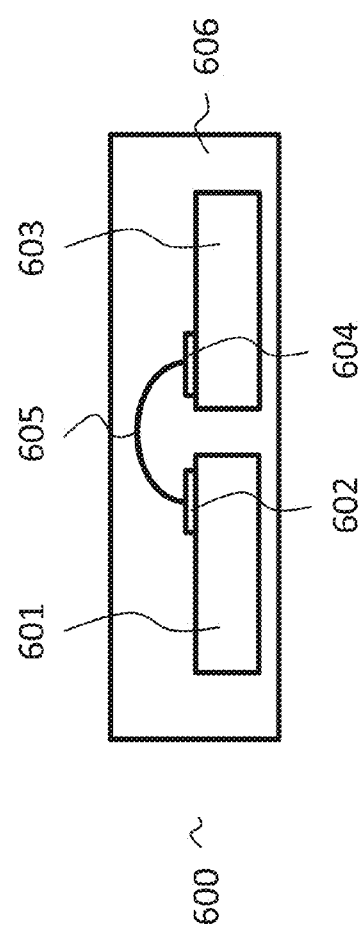
FIG. 6 schematically shows a further embodiment of an electronic device comprising a woven bonding wire.

Referring now to FIG. 6, an embodiment of an electronic device 600 is shown. Electronic device 600 comprises a first semiconductor element 601 comprising a first contact pad 602, a second semiconductor element 603 comprising a second contact pad 604, a woven bonding wire 605 electrically connecting the first and second contact pads 602, 604, and an encapsulant 606 encapsulating the first and second semiconductor elements 601, 603 and the woven bonding wire 605.

FIG. 7A shows a first electronic device 700A and a second electronic device 700B. The first electronic device 700A comprises a standard bonding wire 701A, a first substrate 702 and a second substrate 703. Bonding wire 701A may be connected to the first substrate 702 via a ball bond 702A and it may be connected to the second substrate via a wedge bond 703A. Bonding wire 701A may be guided out of the ball bond 702A vertically or almost vertically and may loop over to wedge bond 703A, where it may touch the second substrate 703 tangentially or almost tangentially.

Guiding a bonding wire out of a ball bond in a vertical or almost vertical direction may be necessary to avoid breaking of the bonding wire near the ball bond as described further below in connection with FIGS. 8 and 9.

Bonding wire 701A reaches a maximum height 704A above the surface of ball bond 702A. This may require encapsulation of electronic device 700A up to a height of 705A above the surface of ball bond 702A. Height 705A may contribute to a significant portion of the overall thickness 706A of the electronic device 700A.

Figure 7:
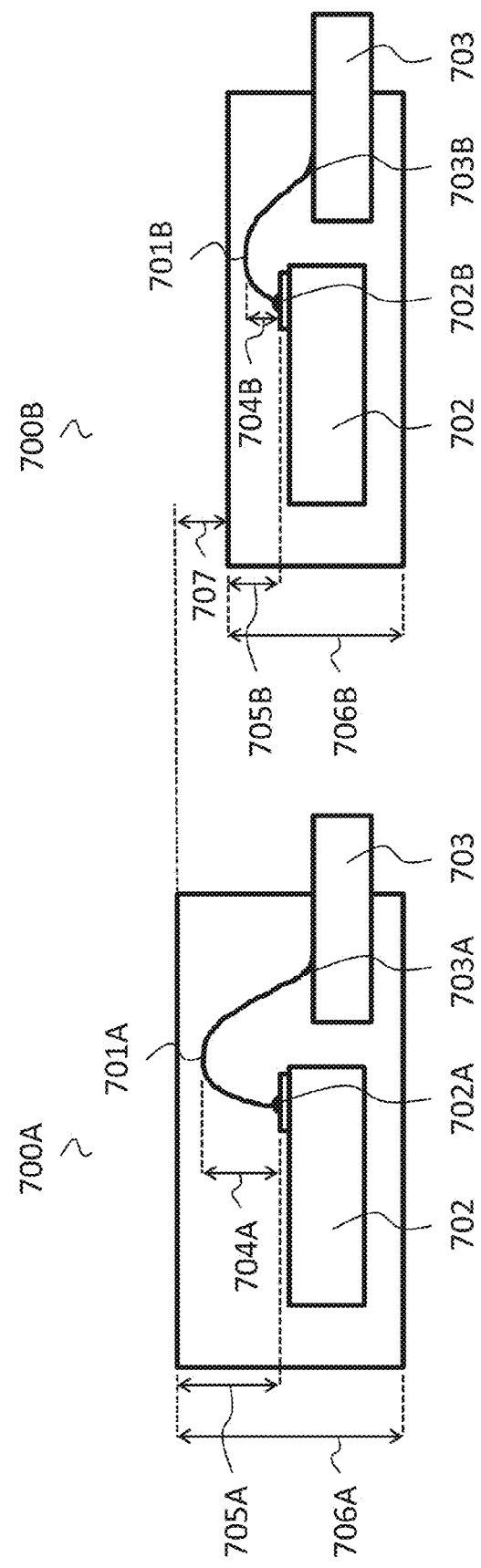
FIG. 7 schematically shows a comparison of an embodiment of an electronic device comprising an woven bonding wire and another electronic device comprising a regular bonding wire.

The right half of FIG. 7 shows a second electronic device 700B, wherein similar numerals denote similar parts as in first electronic device 700A. However, second electronic device 700B comprises a woven bonding wire 701B instead of a standard bonding wire 701A. Woven bonding wire 701B may be connected to first and second substrates 702 and 703 via ball bond 702B and wedge bond 703B, respectively.

Woven bonding wire 701B may be mechanically more flexible than standard bonding wire 701A and may exhibit a smaller Heat Affected Zone (HAZ) as described in connection with FIG. 9. Therefore, woven bonding wire 701B may be more tightly bent than standard bonding wire 701A. This means that a maximum height 704B of woven bonding wire 701B above the plane of ball bond 702B may be lower than maximum height 704A of standard bonding wire 701A. Therefore, a height 705B may be smaller than height 705A and a thickness 706B of electronic device 700B may be smaller than thickness 706A of electronic device 700A by a margin 707.

Note that in the particular embodiments of an electronic device of FIG. 7, the first substrate 702 may be a semiconductor element and second substrate 703 may be a lead frame. However, any embodiment of an electronic device like, for example the embodiments 100 and 600 comprising a woven bonding wire, may profit from a smaller possible overall thickness due to the possibility of bending a woven bonding wire more strongly than a standard bonding wire.

Note further that the embodiments of electronic devices comprising a woven bonding wire shown in FIGS. 1, 6 and 7 are only meant to be exemplary. Woven bonding wires may of course be advantageously used in other embodiments of electronic devices as well. In particular, woven bonding wires may be used in any electronic device, in particular any power semiconductor device or any integrated circuit semiconductor device wherein standard bonding wires are used.

Figure 8:
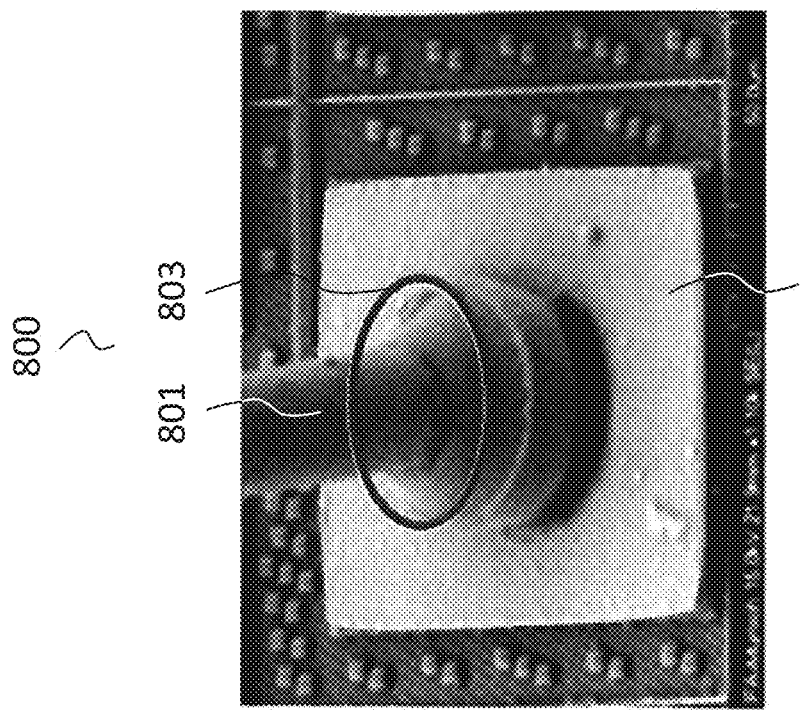
FIG. 8 shows an electron microscope view of a bonding wire ball bonded to a substrate.

Referring now to FIG. 8, an electron microscope view 800 of a standard bonding wire 801 ball bonded to a substrate 802 is shown. The highlighted region 803 denotes the neck region of the ball bond. In the case that an overly strong mechanical stress is applied to bonding wire 801 a mechanical failure such as a crack may occur, typically in the neck region 803. Bending the bonding wire 801 too tightly when looping it over to the second bond is an example of an overly strong mechanical stress. Due to its higher flexibility than a standard, single stranded bonding wire, a woven bonding wire may allow a more tightly bent loop without risking a mechanical failure, especially in the neck region 803.

Figure 9:
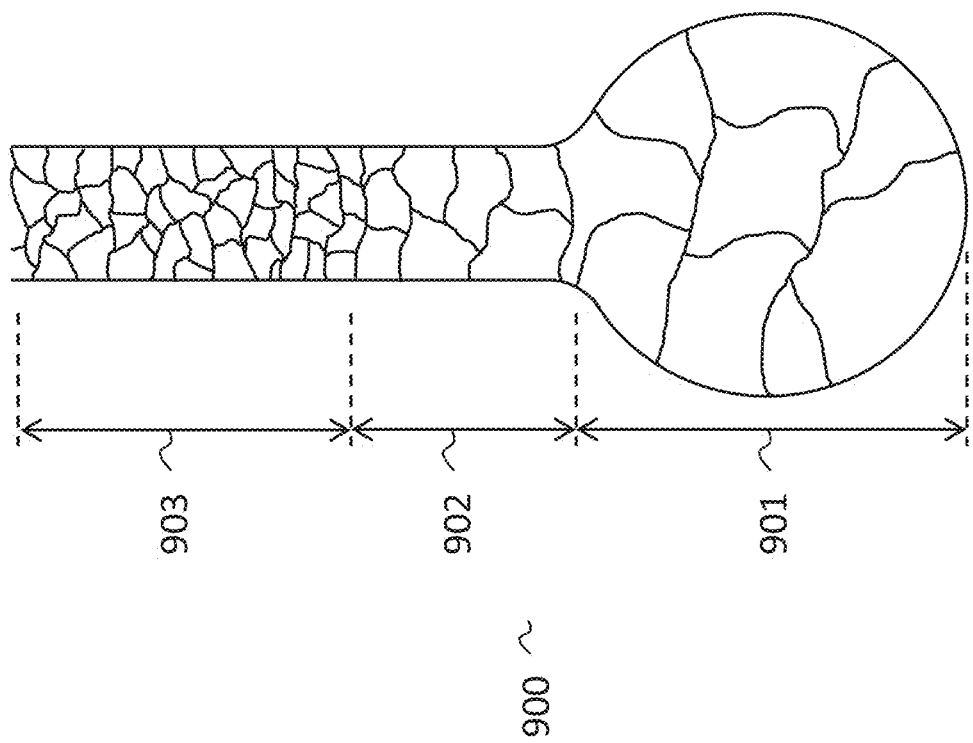
FIG. 9 schematically shows a bonding wire comprising a Free Air Ball (FAB) as it is used in ball bonding well known in the art.

Referring now to FIG. 9, there is shown a schematic view 900 of a bonding wire in a state wherein the ball bond is not yet formed. Region 901 depicts a Free Air Ball (FAB), typically formed by Electronic Flame Off (EFO) at the start of a wire bonding process as is well known in the art. Region 902 depicts the Heat Affected Zone (HAZ) and region 903 depicts the thermally stable zone.

During wire bonding, the FAB 901 is usually ultrasonically or thermosonically bonded to a substrate (for example a semiconductor device), thus creating a first contact. The wire 900 is then looped over to a second substrate (for example a lead frame) and wedge bonded to it ultrasonically, thus creating the second contact. The wire is then torn off behind the wedge bond and the wire bonding process is started anew. This process is well known in the art. The necessary height of the loop is affected by the HAZ 902, with a larger HAZ requiring a bigger, that is less tightly bent loop. The length of the HAZ in the wire depends on the heat flux during the EFO step. The melting and resolidification of the FAB 901 and the size of the HAZ 902 mainly depend on the wire diameter, the discharge current, the voltage drop, the distance between the electrodes, the cover gas pressure and the duration of the discharge in the EFO step.

Due to the heat of the EFO treatment, the FAB 901 and HAZ 902 exhibit a larger grain size than the thermally stable zone 903. This in turn leads to an increase of a brittleness of the FAB and HAZ compared to the thermally stable zone 903. If the mechanical stress on the HAZ is too high in a stress test or during operational life, neck cracks may occur. This may lead to electrical failure of the bonding wire 900.

The increase in brittleness may make it necessary to increase the mechanical stability of a packaged electronic device comprising a ball bond fabricated with bonding wire 900. The mechanical stability of such an electronic device may, for example, be increased by increasing the thickness 706A, 706B (compare FIG. 7) of the package.

Using a woven or twisted bonding wire instead of a standard bonding wire may offer several advantages. For example, lower EFO parameters may be used, for example a shorter application time or a lower EFO current. This will cause a smaller HAZ which in turn may make it possible to use a smaller loop height 704B as shown in FIG. 7.

Furthermore, it may make it possible to use thinner wires and therefore less material to carry the same power loading. This may reduce the cost.

Yet further, using a woven bonding wire may improve the reliability of an electrical connection fabricated by using the woven bonding wire compared to a standard bonding wire. This may be due to the smaller brittle HAZ and the redundancy a woven bonding wire with several strands provides. Using standard wires it is necessary to bond several wires to provide redundancy in the case that a single wire breaks. Therefore, the usage of a woven bonding wire may be significantly cheaper.

A woven bonding wire may exhibit a higher breaking load compared to a single stranded standard wire. This may lead to a smaller likelihood of wire breaks during looping of the wire from the first contact to the second contact. This in turn may increase the units per hour a wire bonder can process.

A woven bonding wire may exhibit lower rigidity than a standard wire. This may decrease the work hardening of the wire. Work hardening may occur during fabrication of the electronic device wherein the bonding wire is comprised or during routine operation. A decreased work hardening may result in a smaller failure rate.

Figure 10:
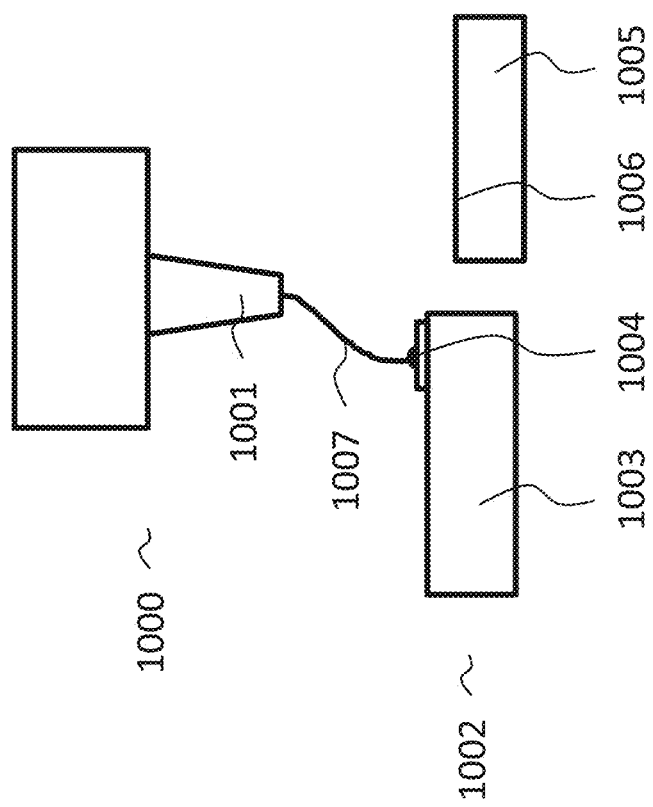
FIG. 10 schematically shows an embodiment of an apparatus for fabricating wire bonds using a woven bonding wire.

Referring now to FIG. 10, there is shown an apparatus 1000 comprising a nozzle 1001 for fabricating wire bonds using a woven bonding wire 1007. The apparatus 1000 may be used to bond woven bonding wire 1007 to a first substrate 1003 of an electronic device 1002, creating a first contact 1004, to loop over the woven bonding wire 1007 to a second substrate 1005, and to bond woven bonding wire 1007 to the second substrate 1005, creating a second contact 1006.

According to an embodiment, the first contact 1004 may be a ball bond and the second contact 1006 may be a wedge bond.

According to an embodiment apparatus 1000 may be a standard wire bonder as used when bonding standard bonding wires. The same configuration of apparatus 1000 as when bonding a standard bonding wire may be used when bonding a woven bonding wire. According to an embodiment, a different configuration of apparatus 1000 may be used when bonding a woven bonding wire. For example, a different nozzle 1001, or different EFO settings, or a different pressure when applying the wire to the first or second substrate may be used.

According to one embodiment, apparatus 1000 is loaded with two or more strands and is used to combine the two or more strands to fabricate woven bonding wire 1007. According to another embodiment, woven bonding wire 1007 is fabricated in another work station than apparatus 1000 and is loaded into apparatus 1000. Fabrication of woven bonding wire 1007 comprises twisting the two or more strands.

Figure 11:
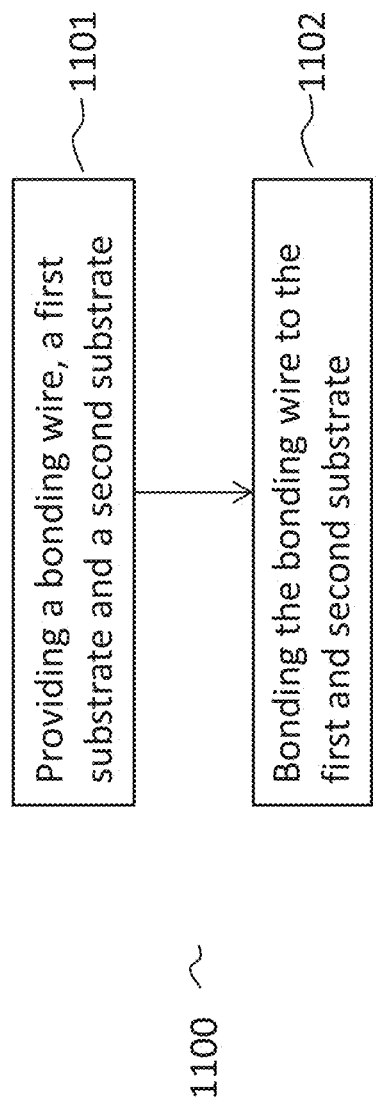
FIG. 11 shows a block diagram of a method for fabricating wire bonds using a woven bonding wire.

Referring now to FIG. 11, there is shown a block diagram of a method 1100 for fabricating a wire bond using a woven bonding wire. The method 1100 comprises a first step 1101 and a second step 1102. First step 1101 comprises providing a woven bonding wire, a first substrate and a second substrate. Second step 1102 comprises bonding the woven bonding wire to the first substrate and to the second substrate.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

The invention claimed is:

1. An electronic device comprising:
a semiconductor chip and a substrate; and
a multi-stranded bonding wire connecting the semiconductor chip and the substrate;
wherein the multi-stranded bonding wire comprises two or more strands directly connected with each other and twisted around each other, and
wherein at a first end of the multi-stranded bonding wire the strands are melted together into a Free Air Ball which is deformed into a bond ball bonding the multi-stranded bonding wire on the semiconductor chip.

2. The device according to claim 1, wherein the multi-stranded bonding wire comprises two or more strands twisted symmetrically around a center axis.

3. The device according to claim 2, wherein the two or more strands comprise one or more of the same material and the same diameter.

4. The device according to claim 2, wherein at least one of the two or more strands comprises one or more of a different material, a different diameter, a different electrical conductivity, and a different tensile strength than the rest of the two or more strands.

5. The device according to claim 2, wherein the multi-stranded bonding wire comprises a coating.

6. The device according to claim 5, wherein the two or more strands are individually coated.

7. The device according to claim 2, wherein the two or more strands each have a diameter of 10-100 μm.

8. The device according to claim 1, wherein the multi-stranded bonding wire comprises one or more of aluminum, copper, tungsten and gold.

9. The device according to claim 1, wherein the electronic device is a high frequency device operational at frequencies of 1 megahertz or higher.

10. The device according to claim 1, wherein the electronic device is a power semiconductor device.

11. An electronic device, comprising:
a semiconductor element and a substrate; and
a multi-stranded bonding wire connected to the semiconductor element and the substrate;
wherein the multi-stranded bonding wire comprises a non-circular cross-section,
wherein the multi-stranded bonding wire comprises two or more strands, and
wherein one out of each one of the two or more strands comprises an individual insulating coating that is arranged concentrically all around of the respective strand, the individual insulating coating having an equal thickness in a radial direction around a circumference of the respective strand, and wherein the multi-stranded bonding wire comprises a collective insulating coating such that the two or more strands are electrically connected to one another.

12. The device according to claim 11, wherein the multi-stranded bonding wire comprises two or more strands.

13. A method of fabricating electrical connections in an electronic device, comprising:
providing a first substrate and a second substrate;
providing a multi-stranded bonding wire;
electrically connecting the first substrate and the second substrate using the multi-stranded bonding wire;
wherein the multi-stranded bonding wire comprises two or more strands directly connected with each other, and
wherein electrically connecting the first substrate and the second substrate comprises forming a Free Air Ball by melting the two or more strands at a first end of the multi-stranded bonding wire and bonding the Free Air Ball ultrasonically or thermosonically to the first substrate.

14. The method according to claim 13, wherein the first substrate comprises a semiconductor element; and
wherein the second substrate comprises a semiconductor element or a lead frame.

15. The method according to claim 13, further comprising:
encapsulating the electrical connection in an encapsulant.

* * * * *